United States Patent
Hopper et al.

(10) Patent No.: US 6,518,646 B1
(45) Date of Patent: Feb. 11, 2003

(54) SEMICONDUCTOR DEVICE WITH VARIABLE COMPOSITION LOW-K INTER-LAYER DIELECTRIC AND METHOD OF MAKING

(75) Inventors: Dawn M. Hopper, San Jose, CA (US); Suzette K. Pangrle, Cupertino, CA (US); Calvin T. Gabriel, Cupertino, CA (US); Richard J. Huang, Cupertino, CA (US); Lu You, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/819,615

(22) Filed: Mar. 29, 2001

(51) Int. Cl.[7] .......................... H01L 23/58; H01L 23/48
(52) U.S. Cl. .................. 257/642; 257/644; 257/759
(58) Field of Search ................. 257/635, 637, 257/641, 642, 643, 644, 649, 759; 438/723, 724, 725, 744, 757, 623

(56) References Cited

U.S. PATENT DOCUMENTS

| | | | |
|---|---|---|---|
| 4,756,977 A | 7/1988 | Haluska et al. | 428/704 |
| 5,866,945 A | 2/1999 | Chen et al. | 257/750 |
| 5,937,323 A | 8/1999 | Orczyk et al. | 438/624 |
| 5,981,354 A | 11/1999 | Spikes et al. | 438/424 |
| 6,001,730 A | 12/1999 | Farkas et al. | 438/627 |
| 6,008,120 A | 12/1999 | Lee | 438/634 |
| 6,083,851 A | 7/2000 | Shields et al. | 438/776 |
| 6,222,256 B1 * | 4/2001 | Matsuura et al. | 257/640 |
| 6,265,780 B1 * | 7/2001 | Yew et al. | 257/759 |

FOREIGN PATENT DOCUMENTS

JP    1-149485    * 6/1989

OTHER PUBLICATIONS

"Solving the Integration Challenges of Low–K Dielectrics", L. Peters, Semiconductor International, Nov. 1999, pp. 1–7.
U.S. patent application No. 09/511,585.

* cited by examiner

Primary Examiner—Steven Loke
Assistant Examiner—Hung Kim Vu

(57) ABSTRACT

Strong adhesion to doped low-k inter-layer dielectrics is provided by varying the composition of dopant near the surface layers of the inter-layer dielectric. The concentration of dopant is gradually increased from about zero atomic % at the interface between the inter-layer dielectric and semiconductor substrate to improve adhesion of the inter-layer dielectric to the semiconductor substrate. The concentration of dopant at the upper surface of the inter-layer dielectric is gradually decreased to about zero atomic % at the upper surface of the inter-layer dielectric film in order to improve adhesion of additional layers to the inter-layer dielectric.

14 Claims, 3 Drawing Sheets

SEMICONDUCTOR DEVICE WITH VARIABLE COMPOSITION LOW-K INTER-LAYER DIELECTRIC AND METHOD OF MAKING

RELATED APPLICATIONS

This application contains subject matter similar to subject matter disclosed in copending U.S. patent applications Ser. No. 09/817,050 filed on Mar. 27, 2001 and Ser No. 09/819,987 filed on Mar. 29, 2001.

TECHNICAL FIELD

The present invention relates to a method of manufacturing a semiconductor device exhibiting reduced capacitance loading. The present invention has particular applicability in manufacturing high density, multi-level semiconductor devices comprising sub-micron dimensions and exhibiting high circuit speed.

BACKGROUND OF THE INVENTION

Interconnection technology is constantly challenged to satisfy the ever-increasing requirements for high density and performance associated with ultra large-scale integration semiconductor devices. The speed of semiconductor circuitry varies inversely with the resistance (R) and capacitance (C) of the interconnection system. The higher the value of the R×C product, the more limiting the circuit speed. As integrated circuits become more complex and feature sizes and spacings become smaller, the integrated circuit speed becomes less dependent upon the transistor itself and more dependent upon the interconnection pattern. Thus, the performance of multi-level interconnects is dominated by interconnect capacitance at deep sub-micron regimes. The rejection rate due to integrated circuits speed delays in sub-micron regimes has become a limiting factor in fabrication.

The dielectric constant of materials currently employed in the manufacture of semiconductor devices for an inter-layer dielectric (ILD) ranges from about 4.0 for dense silicon dioxide to over 8 for deposited silicon nitride. The value of the dielectric constant expressed herein is based upon a value of one for a vacuum. In an effort to reduce interconnect capacitance, dielectric materials with lower values of permittivity have been explored. The expression "low-k" material has evolved to characterize materials with a dielectric constant less than about 3.9.

ILD dielectric materials must be able to serve a number of different purposes requiring diverse characteristics and attributes. For example, the ILD material must: prevent unwanted shorting of neighboring conductors or conducting levels by acting as a rigid, insulating spacer; prevent corrosion and or oxidation of metal conductors, by acting as a barrier to moisture and mobile ions; fill deep, narrow gaps between closely spaced conductors; and undergo planarization of uneven surface topography so that a relatively flat level of conductors can be reliably deposited thereon. ILD films or layers must be formed at relatively low temperatures in order to avoid damage to or destruction of underlying conductors. In addition, many low-k dielectric materials have low oxide content which makes the material inadequate as an etch stop layer.

Silicon nitride has been the etch stop material of choice for making interconnect lines in low-k dielectric materials. However, silicon nitride has a relatively high dielectric constant (k of about 7) compared to the surrounding low-k dielectric layers. Furthermore, silicon nitride does not strongly adhere to organic doped silica glass (OSG) and fluorine doped silica glasses (FSG) low-k dielectrics.

One type of low-k material that has been explored are a group of flowable oxides which are basically ceramic polymers, such as hydrogen silsesquioxane (HSQ). Such polymers and their use are disclosed in, for example, U.S. Pat. No. 4,756,977 and U.S. Pat. No. 5,981,354. HSQ-type flowable oxides have been considered for gap filling between metal lines because of their flowability and ability to fill small openings. HSQ-type flowable oxides have been found to be vulnerable to degradation during various fabrication steps, including plasma etching. Methods involving plasma treatment have been developed to address such problems attendant upon employing HSQ-type flowable oxides as a gap filling layer, as in the U.S. Pat. No. 5,866,945 and U.S. Pat. No. 6,083,851.

There are several organic low-k materials, typically having a dielectric constant of about 2.0 to about 3.8, which offer promise for use as an ILD. Organic low-k materials which offer promise are carbon-containing dielectric materials such as FLARE 20 198 dielectric, a poly(arylene) ether, available from Allied Signal, Advanced Micromechanic Materials, Sunnyvale, Calif.; BCB (divinylsiloxane bis-benzocyclobutene), and Silk™, or porous Silk™ dielectric, organic polymers similar to BCB, both available from Dow Chemical Co., Midland, Mich.; and organic doped silica glass (OSG) (also known as carbon doped glass) including Black-Diamond™ dielectric available from Applied Materials, Santa Clara, Calif.; Coral™ dielectric available from Novellus, San Jose, Calif., and Aurora™ dielectric available from ASM America, Phoenix, Ariz.

In attempting to employ such carbon-containing low-k materials in interconnect technology, as for gap filling or as an ILD, it was found that their dielectric constant became undesirably elevated as a result of subsequent processing. For example, the dielectric constant of BCB was found to increase from about 2.6 to greater than about 4. It is believed that such an increase occurs as a result of exposure to an oxygen ($O_2$) plasma stripping technique employed to remove photoresist material after formation of an opening in a dielectric layer, as, for example, a via hole or dual damascene opening for interconnecting metal features on different metal levels.

Other suitable types of low-k dielectrics are fluorine doped silica glasses (FSG). FSG include dielectrics formed from precursor gases $SiF_4$, $SiH_4$ and $N_2O$ and dielectrics formed from the precursors $SiF_4$, tetraethylorthosilicate (TEOS), and $O_2$. Dielectrics formed from TEOS and $SiF_4$ are known as fluorinated TEOS or FTEOS. FSGs typically exhibit a dielectric constant of about 3.6. It is believed that fluorine lowers the dielectric constant of silicon oxide films because fluorine is an electronegative atom that decreases the polarizability of the overall SiOF network.

In addition to decreasing the dielectric constant, incorporating fluorine in silica layers can also improve the gap-filling properties of the deposited films. Because fluorine is an etching species, it is believed that fluorine etches the film as it is being deposited. The simultaneous deposition/etching effect preferentially etches the corners of a gap, keeping the gap open so that it fills with void-free FSG.

Unfortunately, there are several problems associated with some FSG layers. One problem is that a poorly formed FSG layer may absorb moisture from the atmosphere, or from the reaction products associated with the deposition. The absorption of water raises the dielectric constant of the FSG.

Absorbed water may also interfere with subsequent wafer processing steps. For many applications, it is desirable that FSG layers do not desorb significant water vapor below about 450° C.

Cap layers provide one method of reducing reabsorption of water into an FSG layer. The cap layer is typically undoped silica glass (USG) layer that is deposited onto an FSG layer with or without baking the FSG layer prior to depositing the cap. The cap may be formed in a separate deposition chamber or pump-down, or the process may be streamlined to follow the FSG layer deposition in the same chamber. Cap layers may provide acceptable protection from water absorption under many conditions.

Another problem associated with some FSG layers is corrosion. If fluorine is loosely bound into the FSG lattice, or has accumulated as free fluorine on the surface, the fluorine may combine with water to form hydrofluoric acid (HF). HF may corrode, and even destroy, other device features such as metal traces or anti reflective layers. One technique that is used to overcome the problems of corrosion is to form a liner over the substrate before depositing the FSG. The liner is typically a thin layer of USG that acts as a barrier between device features and the FSG.

A further problem with some FSG layers is that they are unstable. In other words, the layer characteristics change over time. For example, fully-formed FSG layers may form a cloudy haze, or even bubbles, within the layer when exposed to the atmosphere.

One problem with using a USG capping layer is that the USG capping layer does not adhere well to the fluorine-doped ILD surfaces. The poor adhesion of the capping layer to the ILD increases the likelihood of diffusion or leakage of conductive materials through the porous low-k ILD, which can lead to short circuits. In addition, both carbon and fluorine-doped low-k ILDs also exhibit inadequate adhesion to underlying semiconductor substrates.

The term semiconductor devices, as used herein, is not to be limited to the specifically disclosed embodiments. The semiconductor devices, as used herein, include a wide variety of electronic devices including flip chips, flip chip/package assemblies, transistors, capacitors, microprocessors, and random access memories, etc. In general, semiconductor devices refer to any electrical device comprising semiconductors.

SUMMARY OF THE INVENTION

There exists a need for efficient methodology enabling the use of low-k carbon and fluorine-doped dielectric materials as ILDs in high-density, multi-level connection patterns. There exists a particular need for methodology enabling the use of such low-k materials while avoiding their degradation from various fabrication steps subsequent to deposition. There further exists a particular need in this art to provide for strong adhesion of overlying layers to the ILD and for strong adhesion of the ILD to underlying semiconductor substrates.

These and other needs are met by embodiments of the present invention, which provide a method of forming a semiconductor device with a doped dielectric film on a semiconductor substrate. The dielectric film is formed by the steps of depositing a lower layer of a doped dielectric on a semiconductor substrate. The concentration of dopant is approximately constant throughout the lower layer. An upper layer of doped dielectric, wherein the concentration of dopant in the dielectric film is gradually reduced across the thickness of the upper layer, is deposited on the lower layer.

The earlier-stated needs are also met by another embodiment of the instant invention that provides a semiconductor device comprising a doped dielectric film formed on a semiconductor substrate. The doped dielectric film comprises a lower layer with an approximately constant dopant concentration throughout the lower layer. An upper layer, with a concentration of dopant that is gradually reduced from the concentration of the lower layer, is formed on the lower layer.

The foregoing and other features, aspects, and advantages of the present invention will become apparent in the following detailed description of the present invention when taken in conjunction with the accompanying drawings.

DETAILED DESCRIPTION OF THE OF THE INVENTION

The present invention enables a production of semiconductor devices with increased speed, miniaturization, and reliability. The present invention provides low-k inter-layer dielectrics with improved adhesion to semiconductor substrates and improved adhesion of overlying layers. These objectives are achieved by strategically varying the concentration of dopant in the ILD to provide $SiO_2$-like surfaces on the ILD.

Carbon and fluorine-doped glasses provide low-k dielectrics with good ILD characteristics. However, the concentration of dopant at the surfaces of these ILDs leads to poor adhesion of the ILDs to semiconductor substrates and for adhesion to overlying layers, such as capping, barrier, ARC, and additional dielectric layers. On the other hand, silicon dioxide ($SiO_2$) adheres strongly to semiconductor substrates and also provides strong adhesion of barrier, dielectric, ARC, and capping layers. Carbon and fluorine dopants interfere with an $SiO_2$-like surface, thereby resulting in weaker bonds at the ILD surface. The formation of an $SiO_2$-like surface on carbon and fluorine-doped silica glasses would provide strong adhesion while retaining the beneficial low-k characteristics of the doped silica glass.

In the present invention, $SiO_2$-like surfaces are provided on a doped silica glass ILD by depositing layers of doped dielectric adjacent the upper and lower surfaces of the ILD with gradually varying dopant concentrations. Adjacent the upper surface of the ILD, the concentration of dopant is gradually decreased while adjacent the lower surface of the ILD the concentration of dopant is gradually increased.

Figure 1:
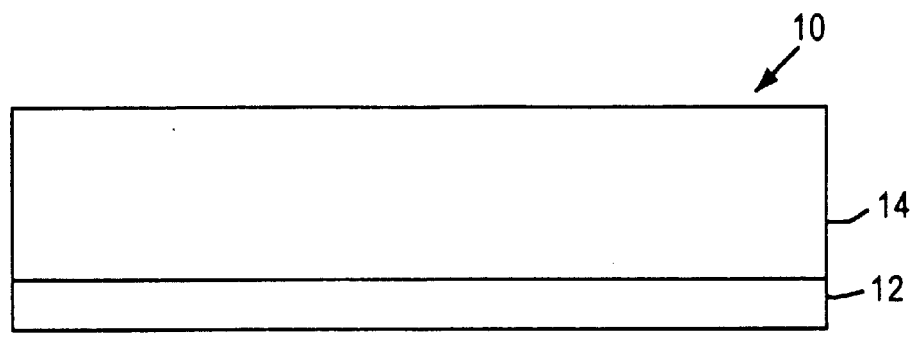
FIG. 1 illustrates an inter-layer dielectric formed on a semiconductor substrate.

As shown in FIG. 1, semiconductor device 10 is formed by depositing a lower layer of a doped dielectric 14 on semiconductor substrate 12. The doped dielectric includes carbon-doped (or organic-doped) silica glasses, such as SiCOH, and fluorine-doped glasses such as fluorine-doped silica glass (FSG) or in particular fluorine-doped tetraethylorthosilicate (FTEOS).

The concentration of carbon and fluorine dopant ranges from about 5 atomic % to about 20 atomic % in the carbon and fluorine doped glasses. The concentration of dopant in ILD 14 is approximately constant throughout the layer.

SiCOH, which exhibits a dielectric constant of about 2.4 to about 3.1, contains carbon in the amount of about 5 to about 20 atomic %, silicon in the amount of about 15 to about 25 atomic %, oxygen in the amount of about 25 to about 35 atomic %, and hydrogen in the amount of about 35 to about 45 atomic %. SiCOH contains SiC, SiH, CH, and SiOH bonding.

The SiCOH ILD, in a first embodiment of the invention, is formed using a plasma enhanced chemical vapor deposition technique (PECVD). To form the SiCOH layer 14, a mixture comprising a methylsilane and oxygen dielectric precursor gases are introduced into the PECVD reactor chamber. The preferred methylsilanes for forming SiCOH are trimethylsilane and tetramethylsilane. Trimethylsilane will be used as the exemplified methylsilane for purposes of describing this invention. The trimethylsilane is introduced into the reactor at a flow rate of about 400 to about 800 sccm; oxygen is introduced into the reactor at a flow rate of about 50 to about 3000 sccm; a pressure of about 2 to about 8 torr is maintained in the reactor; and RF power of about 50 to about 600 watts is maintained; and a temperature of about 250° C. to about 450° C.; for 20 or more seconds depending on the desired thickness.

In certain embodiments, suitable reactor parameters include an $O_2$ flow rate of about 50 to about 150 sccm; RF power of about 400 to about 600 watts; a temperature of about 300° C. to about 425° C.; and a spacing distance between the semiconductor substrate and the plasma source of about 0.5 to about 0.9 cm.

Figure 2:
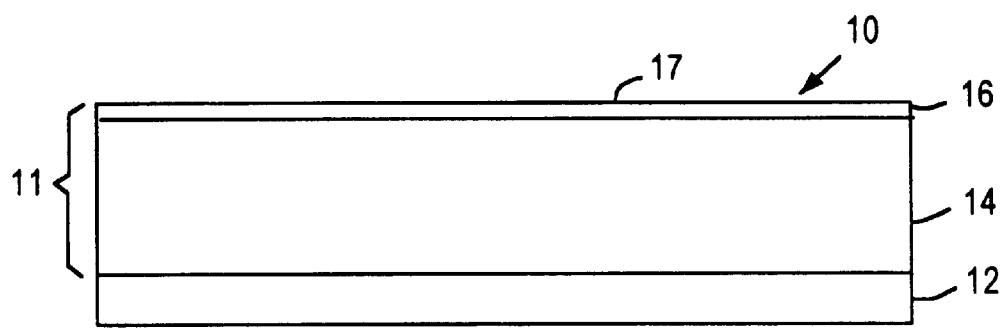
FIG. 2 illustrates a semiconductor substrate with a dielectric film comprising a lower layer and an upper layer.

The ILD lower layer 14 is deposited to a predetermined thickness, typically about 2000 Å to about 1.2 $\mu$m. After the predetermined thickness of the ILD lower layer 14 is reached, TEOS is introduced into the reactor at a flow rate of 500 to about 3000 sccm. The flow rate of the trimethylsilane is gradually decreased while the flow rate of the TEOS is gradually increased to form the ILD upper layer 16, as shown in FIG. 2, wherein the concentration of dopant in the dielectric film is gradually reduced across the thickness of the upper layer. The flow rates of the precursor gases are varied so that by the time upper surface 17 of upper layer 16 is formed the trimethylsilane flow is reduced to 0 sccm. The concentration of the carbon dopant is reduced from the concentration in the ILD lower layer 14 at the lower layer/upper layer interface to about 0 atomic % at the upper surface of the upper layer. In other words, the surface of the upper layer of the ILD is approximately pure USG. The thickness of the ILD upper layer 16 is about 50 Å to about 500 Å, preferably about 100 Å to about 200 Å. The upper surface 17 of the ILD upper layer 16, which contains approximately 0 atomic % of dopant can range up to about 50 Å thick. The upper layer 16 and lower layer 14 form ILD 11.

In another embodiment, also depicted in FIGS. 1 and 2, lower layer 14 comprises a fluorine-doped silica glass. The fluorine-doped glass is also formed by a PECVD process. The fluorine doped glass dielectric is formed by flowing precursor gases $SiF_4$, $SiH_4$, and $N_2O$ over the semiconductor substrate 12, or alternatively by flowing $SiF_4$, TEOS, and $O_2$ over the semiconductor substrate 12 to form the FSG layer 14.

Alternatively, dual frequency RF power, including high frequency RF power of about 50 to about 150 watts and low frequency RF power of about 200 to about 400 watts, can be used in certain embodiments.

To form FTEOS dielectric suitable PECVD reactor parameters include: $SiF_4$ flow rate of about 50 to about 2000 sccm; TEOS flow rate of about 500 to about 3000 sccm; $O_2$ flow rate of about 400 to about 800 sccm; pressure of about 2 to about 8 torr; RF power of about 50 to about 600 watts; temperature of about 300° C. to about 450° C., for 20 or more seconds depending on desired thickness. The fluorine concentration in the FSG or FTEOS layer 14 ranges from about 5 atomic % to about 20 atomic %.

In certain embodiments, suitable reaction parameters include an $SiF_4$ flow rate of about 600 to about 1000 sccm; TEOS flow rate of about 800 to about 1100 sccm; temperature of about 350 to about 450° C.; pressure of about 2.5 to about 4.5 torr; and a spacing distance between the substrate and the plasma source of about 0.25 to about 0.80 cm. Alternatively, dual frequency RF power, including high frequency RF power of about 50 to about 150 watts and low frequency RF power of about 200 to about 400 watts, can be used in certain embodiments.

To form upper layer 16, the flow rate of $SiF_4$ is reduced with respect to the flow rate of $O_2$ or TEOS. The concentration of fluorine gradually decreases in upper layer 16 to about 0 atomic % at the upper surface 17 of the upper layer 16. In certain embodiments, the uppermost 50 Å of the upper layer 16 can have 0 atomic % of F. The low concentration of F at the upper surface 17 of the upper layer 16 provides a suitable $SiO_2$-like surface for improved adhesion of subsequently deposited layers.

Figure 3:
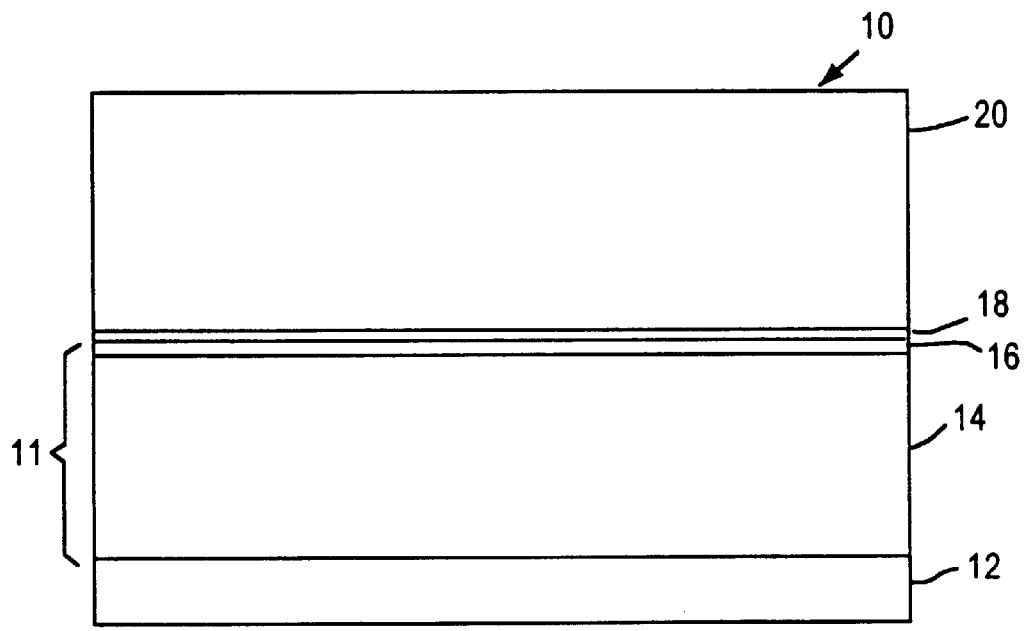
FIG. 3 illustrates a semiconductor substrate with a bi-layer dielectric film with additional overlayers.

The $SiO_2$-like surface of upper layer 16 provides strong adhesion for subsequently deposited additional layers 18. As seen in FIG. 3, additional layers 18, which can be deposited on ILD 11, include anti-reflective coatings (ARC), barrier layers, etch-stop layers, silicon oxide, silicon nitride, SiON, Ta, TaN, Ti, TiN, TiSiN, TaSiN, and WN. As shown in FIG. 3, an additional ILD 20 can be deposited upon additional layer 18. This invention is particularly suitable for forming dual damascene type interconnects with reduced incidents of material diffusion and short-circuits because of the improved adhesion of additional layers 18 and 20 to lower ILD 11.

Figure 4:
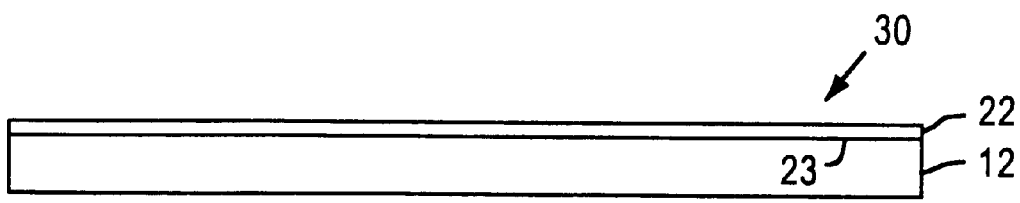
FIG. 4 illustrates a doped dielectric underlayer formed on a semiconductor substrate.
Figure 5:
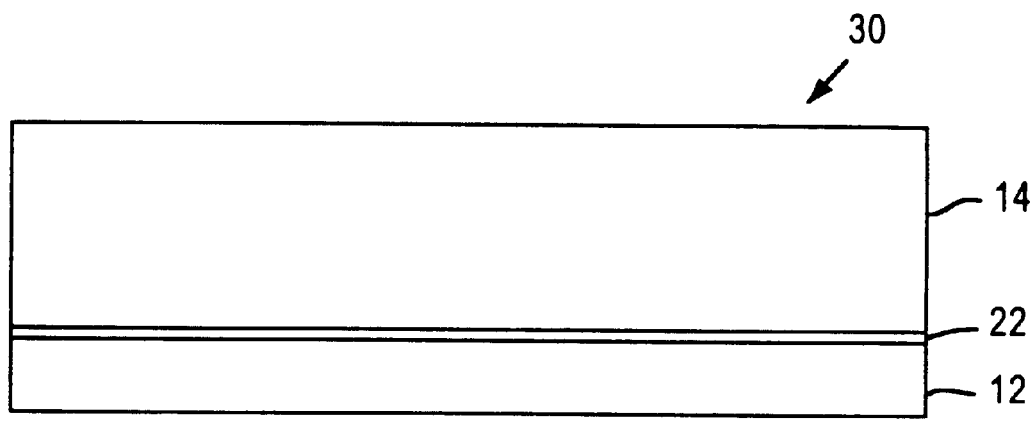
FIG. 5 illustrates a doped inter-layer dielectric with a doped dielectric underlayer formed on a semiconductor substrate.

In another embodiment, an underlying layer 22 is formed on semiconductor substrate 12, as shown in FIG. 4. Underlying layer 22 comprises the ILD material with a gradually increasing concentration of dopant. In layer 22 the concentration of dopant is gradually increased from 0 atomic % to the concentration of dopant in a subsequently formed dielectric layer. As seen in FIG. 5, the subsequently formed dielectric layer may be the same as the lower layer 14 described in FIGS. 1 and 2. The concentration of dopant is increased across the thickness of underlying layer 22 by varying the flow rates of the ILD precursor gases. The low concentration of dopant at the bottom surface 23 of underlying layer 22 provides an $SiO_2$-like surface for improved adhesion of subsequently formed lower layer 14 to semiconductor substrate 12.

To form the underlying layer 22, a mixture of ILD precursor gases is introduced into the PECVD chamber. Precursor gases include TEOS, $O_2$, and $SiF_4$. Initially, the flow rate of $SiF_4$ is zero. The flow rate of $SiF_4$ is gradually increased relative to the flow rate of $O_2$ and TEOS to increase the amount of F up to the concentration of F in lower layer 14. Typically the thickness of underlying layer 22 is about 50 Å to about 500 Å. In certain embodiments the thickness of underlying layer 22 ranges from about 100 Å to about 200 Å. After underlying layer 22 is formed, lower layer 14 is deposited as previously described with respect to FIGS. 1 and 2.

Figure 6:
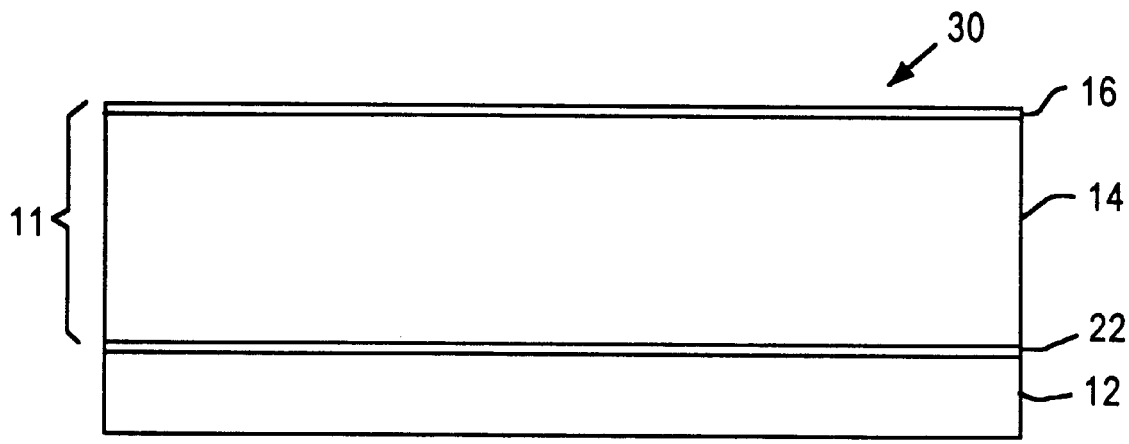
FIG. 6 illustrates a bi-layer inter-layer dielectric with a doped underlying layer formed on a semiconductor substrate.
Figure 7:
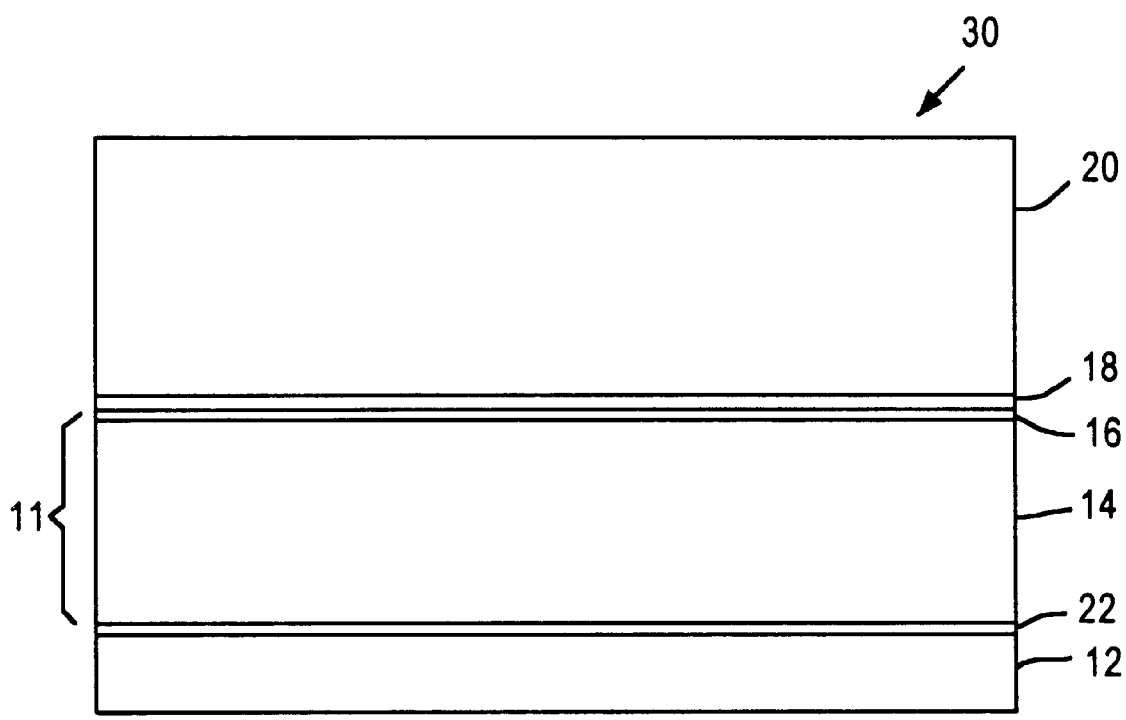
FIG. 7 illustrates additional layers formed on a bi-layer ILD within underlying doped layer formed on a semiconductor substrate.

As shown in FIG. 6, upper layer 16, with a gradually decreasing dopant concentration is formed over lower layer 14. Subsequent to the formation of upper layer 16, additional layer 18 and a second ILD 20 can be formed on lower ILD 11, as shown in FIG. 7.

The present invention allows the formation of strongly adhering, low-k dielectric films on semiconductor substrates. The strongly adhering dielectric films are particularly well suited for forming dual damascene interconnects. The graded composition ILD also provides strong adhesion for barrier layers including refractory metals and refractory metal nitrides concluding Ta, TaN, Ti, TiN, and WN. Additionally, the graded doping composition upper layer also provides strong adhesion for ARC and additional dielectric layers and for liner layers to prevent F diffusion and corrosion. The improved adhesion of overlying layers on the ILD provide a number of benefits including formation of improved metal interconnects, such as Cu interconnects. The improved adhesion of barrier layers to the graded doping composition ILD prevents diffusion of interconnect metals such as Cu and Cu alloys, thereby preventing short circuits.

The embodiments illustrated herein are for illustrative purposes only. The embodiments illustrated should not be construed to limit the scope of the claims. As is clear to one of ordinary skill in the art, the instant disclosure encompasses a wide variety of embodiments not specifically illustrated herein.

What is claimed is:

1. A semiconductor device comprising a doped dielectric film formed on a semiconductor substrate, wherein the doped dielectric film comprises:

a lower layer comprising a dielectric material with an approximately constant concentration of a dopant throughout the lower layer; and an upper layer comprising said dielectric material with a concentration of said dopant that is gradually reduced from the concentration of the lower layer to about 0 atomic % at an upper surface of the upper layer.

2. The semiconductor device of claim 1, wherein the dopant comprises carbon or fluorine.

3. The semiconductor device of claim 2, wherein the doped dielectric film lower layer comprises an organic-doped silica glass with a carbon concentration of about 5 atomic % to about 20 atomic %.

4. The semiconductor device of claim 2, wherein the doped dielectric film lower layer comprises fluorine-doped silica glass with a fluorine concentration of about 5 atomic % to about 20 atomic %.

5. The semiconductor device of claim 1, further comprising a doped dielectric layer underlying the lower layer, wherein the underlying doped dielectric layer comprises a gradually increasing concentration of dopant that increases from about 0 atomic % dopant at the underlying layer/semiconductor substrate interface to the concentration of dopant in the dielectric film lower layer at the underlying layer/lower layer interface.

6. The semiconductor device of claim 5, wherein the thicknesses of the underlying layer and upper layer are each about 50 Å to about 500 Å.

7. A semiconductor device comprising a doped dielectric film formed on a semiconductor substrate, wherein the doped dielectric film comprises:

a lower layer with an approximately constant concentration of dopant throughout the lower layer;

an upper layer with a concentration of dopant that is gradually reduced from the concentration of the lower layer to about 0 atomic % at an upper surface of the upper layer; and a doped dielectric layer underlying the lower layer, wherein the underlying doped dielectric layer comprises a gradually increasing concentration of dopant that increases from about 0 atomic % dopant at the underlying layer/semiconductor substrate interface to the concentration of dopant in the dielectric film lower layer at the underlying layer/lower layer interface.

8. The semiconductor device of claim 7, wherein the thicknesses of the underlying layer and upper layer are each about 50 Å to about 500 Å.

9. A semiconductor device comprising a doped dielectric film deposited on a semiconductor substrate by flowing one or more doped dielectric precursor gases over the semiconductor substrate, wherein the doped dielectric film comprises:

a lower layer with an approximately constant concentration of a dopant throughout the lower layer; and an upper layer with a concentration of said dopant that is gradually reduced from the concentration of the lower layer to about 0 atomic % at an upper surface of the upper layer, wherein said upper layer is deposited by gradually reducing the flow rate of at least one of said doped dielectric precursor gases relative to the flow rate of said at least one precursor gas during deposition of said lower layer.

10. The semiconductor device of claim 9, wherein the dopant comprises carbon or fluorine.

11. The semiconductor device of claim 10, wherein the doped dielectric film lower layer comprises an organic-doped silica glass with a carbon concentration of about 5 atomic % to about 20 atomic %.

12. The semiconductor device of claim 10, wherein the doped dielectric film lower layer comprises fluorine-doped silica glass with a fluorine concentration of about 5 atomic % to about 20 atomic %.

13. The semiconductor device of claim 9, further comprising a doped dielectric layer underlying the lower layer, wherein the underlying doped dielectric layer comprises a gradually increasing concentration of dopant that increases from about 0 atomic % dopant at the underlying layer/semiconductor substrate interface to the concentration of dopant in the dielectric film lower layer at the underlying layer/lower layer interface.

14. The semiconductor device of claim 13, wherein the thicknesses of the underlying layer and upper layer are each about 50 Å to about 500 Å.

* * * * *